US012646585B2

(12) United States Patent
Kim

(10) Patent No.: US 12,646,585 B2
(45) Date of Patent: Jun. 2, 2026

(54) CONTROLLER FOR MANAGING BAD BLOCK, STORAGE DEVICE INCLUDING THE SAME, AND METHOD OF OPERATING THE STORAGE DEVICE

(71) Applicant: SK hynix Inc., Gyeonggi-do (KR)

(72) Inventor: Se Joong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 149 days.

(21) Appl. No.: 18/582,654

(22) Filed: Feb. 21, 2024

(65) Prior Publication Data

US 2025/0104798 A1 Mar. 27, 2025

(30) Foreign Application Priority Data

Sep. 25, 2023 (KR) ........................ 10-2023-0128107

(51) Int. Cl.
*G11C 29/52* (2006.01)
*G11C 29/00* (2006.01)

(52) U.S. Cl.
CPC ............ *G11C 29/789* (2013.01); *G11C 29/52* (2013.01); *G11C 29/76* (2013.01)

(58) Field of Classification Search
CPC ........ G11C 29/789; G11C 29/52; G11C 29/76
See application file for complete search history.

(56) References Cited

U.S. PATENT DOCUMENTS

2022/0197788 A1* 6/2022 Park ..................... G06F 13/1668

FOREIGN PATENT DOCUMENTS

KR 10-0526190 B1 11/2005
KR 10-2287760 B1 8/2021

* cited by examiner

*Primary Examiner* — Alfredo Bermudez Lozada
(74) *Attorney, Agent, or Firm* — IP & T GROUP LLP

(57) ABSTRACT

The present technology relates to a semiconductor device. According to the present technology, a storage device capable of managing a bad block while maintaining interleaving performance may include a data storage device including a plurality of dies connected to a channel, and each of the dies includes a plurality of planes capable of a plane interleaving operation. Each of the planes includes a data storage device including a plurality of memory blocks, and a controller configured to control, when a bad block occurs in a target die among the plurality of dies, the data storage device to determine a replacement die corresponding to the target die among the dies based on replacement die recommendation information and control the data storage device to replace the bad block with a preliminary block included in the replacement die based on information on whether the plane interleaving operation is possible.

19 Claims, 8 Drawing Sheets

| DIE IDENTIFICATION INFORMATION | REPLACEMENT DIE RECOMMENDATION INFORMATION | FULL PLANE INTERLEAVING INFORMATION |
|---|---|---|
| 1 | i | O |
| 2 | i+1 | O |
| ... | ... | ... |
| i | i+i-1 | O |
| ... | ... | ... |
| n-1 | i-2 | O |
| n | i-1 | X |

FIG. 6

REPLACEMENT BLOCK     600

| SUPER BLOCK IDENTIFICATION INFORMATION | FIRST PLANE | SECOND PLANE | THIRD PLANE | FOURTH PLANE | FULL PLANE INTERLEAVING INFORMATION |
|---|---|---|---|---|---|
| 1 | PRELIMINARY BLOCK (IN USE) | PRELIMINARY BLOCK (IN USE) | PRELIMINARY BLOCK (IN USE) | PRELIMINARY BLOCK | O |
| 2 | PRELIMINARY BLOCK | PRELIMINARY BLOCK | PRELIMINARY BLOCK | BAD BLOCK | X |
| . . . | . . . | . . . | . . . | . . . | . . . |
| n | PRELIMINARY BLOCK | BAD BLOCK | PRELIMINARY BLOCK | PRELIMINARY BLOCK | X |

CONTROLLER FOR MANAGING BAD BLOCK, STORAGE DEVICE INCLUDING THE SAME, AND METHOD OF OPERATING THE STORAGE DEVICE

CROSS-REFERENCE TO RELATED APPLICATION

The present application claims priority under 35 U.S.C. § 119(a) to Korean patent application number 10-2023-0128107 filed on Sep. 25, 2023, the entire disclosure of which is incorporated by reference herein.

BACKGROUND

1. Field of Invention

Various embodiments of the present disclosure relate to a semiconductor device, and more particularly, to a controller for managing a bad block, a storage device including the same, and a method of operating the storage device.

2. Description of Related Art

A storage device is a device that stores data according to a request from a host device such as a computer or a smart phone. The storage device may include a data storage device in which data is stored and a controller that controls the data storage device. The data storage device may include a plurality of dies connected to a channel.

The storage device may manage a preliminary block for replacing a memory block determined as a bad block in the data storage device. For example, when an operation on a memory block is failed, the storage device may determine that the corresponding memory block is the bad block. The storage device may replace the bad block with the preliminary block.

Meanwhile, the plurality of dies may perform operations in parallel according to an interleaving method. In addition, each of the plurality of dies may include a plurality of planes, and the plurality of planes may perform operations in parallel according to an interleaving method. Accordingly, a method of replacing the bad block with the preliminary block and maintaining interleaving performance of the data storage device may be required.

SUMMARY

Embodiments of the present disclosure provide a controller capable of managing a bad block while maintaining interleaving performance, a storage device including the same, and a method of operating the storage device.

According to an embodiment of the present disclosure, a storage device may include a data storage device including a plurality of dies each including a plurality of planes, and a controller configured to control the data storage device to perform a program operation. Each of the plurality of planes includes a plurality of memory blocks and a plurality of preliminary blocks. The controller may control, when a bad block occurs in a target die among the plurality of dies, the data storage device to determine a replacement die corresponding to the target die among the plurality of dies based on replacement die recommendation information corresponding to each of the plurality of dies, select a replacement block among the plurality of preliminary blocks included in the replacement die based on information on whether a full plane interleaving operation corresponding to the replacement die is possible, and control the data storage device to replace the bad block with the replacement block.

According to an embodiment of the present disclosure, a method of operating a storage device including a plurality of dies each including a plurality of planes each including a data storage device including a plurality of memory blocks and a plurality of preliminary blocks, and a controller controlling the data storage device may include generating replacement die recommendation information corresponding to each of the plurality of dies, generating information on whether a full plane interleaving operation corresponding to each of the plurality of dies is possible, issuing a program command instructing a program operation of a target die among the plurality of dies, detecting a bad block during the program operation of the target die, determining whether a replacement block exists among the plurality of preliminary blocks included in the target die, determining a replacement die corresponding to the target die among the plurality of dies based on the replacement die recommendation information, in response to a determination that the replacement block does not exist in the target die, determining the replacement block among the plurality of preliminary blocks included in the replacement die based on the information on whether the full plane interleaving operation corresponding to the replacement die is possible, and replacing the bad block with the replacement block included in the replacement die.

According to an embodiment of the present disclosure, a controller for controlling a data storage device including a plurality of dies each including a plurality of planes each including a plurality of memory blocks and a plurality of preliminary blocks may include a memory configured to store a remapping information table including replacement die recommendation information corresponding to each of the plurality of dies and information on whether a full plane interleaving operation is possible, and a processor configured to select, when a bad block occurs in a first die among the plurality of dies, a replacement block for replacing the bad block among the plurality of preliminary blocks included in a second die other than a first die among the plurality of dies, based on the remapping information table.

According to embodiments of the present disclosure, a controller capable of managing a bad block while maintaining interleaving performance, a storage device including the same, and a method of operating the storage device are provided.

BRIEF DESCRIPTION OF THE DRAWINGS

FIG. 2 is a diagram for describing replacing a bad block with a preliminary block included in a target die according to an embodiment of the present disclosure.

FIG. 4 shows a remapping information table according to an embodiment of the present disclosure.

FIG. 6 is a diagram for describing information on whether a full plane interleaving operation is possible according to an embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, in order to describe in detail enough that a person of ordinary skill in the art to which the present disclosure pertains may easily implement the technical spirit of the present disclosure, an embodiment of the present disclosure is described with reference to the accompanying drawings.

Figure 1:
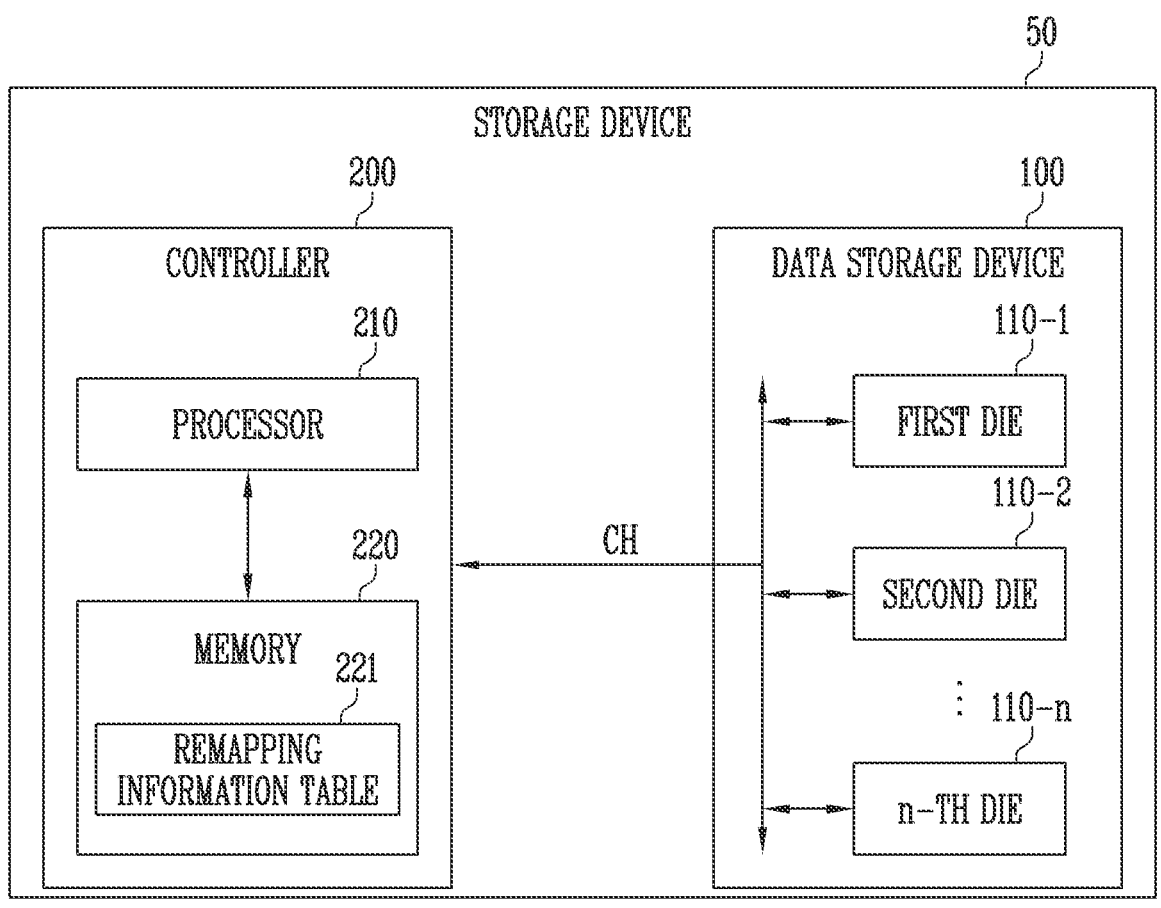
FIG. 1 is a diagram illustrating a storage device according to an embodiment of the present disclosure.

FIG. 1 is a diagram illustrating a storage device 50 according to an embodiment of the present disclosure.

Referring to FIG. 1, the storage device 50 may be a device that stores data according to a request from a host device (an external device, not shown). The storage device 50 may be manufactured as any one of various types of storage devices according to a communication method with the host device. In addition, the storage device 50 may be manufactured in any one of various types of packages.

The storage device 50 may include a data storage device 100 and a controller 200.

The data storage device 100 may be a non-volatile memory.

The data storage device 100 may include a memory cell array including a plurality of memory cells that store data.

The memory cell array may include a plurality of memory blocks. Each memory block may include a plurality of memory cells. One memory block may include a plurality of pages. In an embodiment, a page may be a unit for storing data in the data storage device 100 or for reading data stored in the data storage device 100. A memory block may be a unit for erasing data.

In an embodiment, the data storage device 100 may include a plurality of dies 110-1 to 110-$n$ commonly connected to a channel CH. Each of the plurality of dies 110-1 to 110-$n$ may include a plurality of planes that are able to perform a plane interleaving operation. The plane interleaving operation may be a method of controlling an operation to overlap at least two or more planes.

In an embodiment, each of the plurality of dies 110-1 to 110-$n$ may include a plurality of planes that are able to perform a full plane interleaving operation. The full plane interleaving operation may be a method of controlling an operation to overlap all planes included in one die.

In an embodiment, each of the plurality of planes may include a plurality of memory blocks.

In an embodiment, the data storage device 100 may receive a command and an address from the controller 200 and perform an operation instructed by the command on an area selected by the address in the memory cell array. In the present specification, a logical address may be used as the same meaning as a "logical block address" or a "logic address". In the present specification, a physical address may be used as the same meaning as a "physical block address" or a "physic address".

In an embodiment, the data storage device 100 may include preliminary blocks for replacing a bad block. For example, each of the plurality of dies 110-1 to 110-$n$ may include a plurality of preliminary blocks.

The controller 200 may control operations of the storage device 50.

In an embodiment, the controller 200 may include a processor 210 and a memory 220. Although not shown in FIG. 1, the controller 200 may further include a host interface for communicating with the host device, a memory interface for communicating with the data storage device 100, and an error correction circuit for generating a parity by error correction code (ECC) encoding program data provided from the host device and for ECC decoding read data read from the data storage device 100 using the parity.

The processor 210 may be configured of a micro control unit (MCU), a central processing unit (CPU), or the like.

The processor 210 may drive firmware loaded and stored in the memory 220 to control internal functions of the controller 200 or the data storage device 100. The processor 210 may generate control signals to control operations of the data storage device 100 and provide the generated control signals to the data storage device 100.

The memory 220 may be a volatile memory. The memory 220 may store the firmware driven by the processor 210.

In addition, the memory 220 may temporarily store the program data to be transmitted to the data storage device 100 or the read data read from the data storage device 100.

That is, the memory 220 may operate as an operation memory or a buffer memory of the processor 210.

In an embodiment, the memory 220 may include a remapping information table 221. The remapping information table 221 may include replacement die recommendation information corresponding to each of the plurality of dies 110-1 to 110-$n$ and information on whether the full plane interleaving operation is possible.

When power is applied to the storage device 50, the controller 200 may execute firmware. When the data storage device 100 is a flash memory, the firmware may include a host interface layer (HIL) that controls communication with the host device, a flash translation layer (FTL) that controls communication between the host device and the data storage device 100, and a flash interface layer (FIL) that controls communication with the data storage device 100.

The controller 200 may provide the data storage device 100 with a command, an address, and data corresponding to a corresponding operation to perform a program operation, a read operation, an erase operation, or the like according to a request from the host device.

In an embodiment, the controller 200 may independently generate the command, the address, and the data and transmit the command, the address, and the data to the data storage device 100, regardless of the request of the host device. For example, the controller 200 may provide a command, an address, and data for performing a program operation and a read operation involved in performing an internal operation such as wear leveling, read reclaim, garbage collection, or the like to the data storage device 100.

In an embodiment, the controller 200 may be connected to the plurality of dies 110-1 to 110-$n$ through the channel CH. The controller 200 may control the plurality of dies 110-1 to 110-$n$ according to a die interleaving method to improve operation performance. The die interleaving method may be a method of controlling operations on at least two or more dies to overlap.

In an embodiment, the controller 200 may manage a bad block. For example, when an operation on a specific memory block is failed, the controller 200 may determine the corresponding memory block as the bad block. In this case, the controller 200 may replace the bad block with a preliminary block. An operation of replacing the bad block with the preliminary block may be referred to as a 'remapping operation'. In an embodiment, the replaced preliminary block may be an unused block and may be referred to as a 'replacement block'.

In an embodiment, the remapping operation may be an operation of moving data stored in the bad block to the preliminary block and replacing a logical address mapped to a physical address of the bad block with a physical address of the preliminary block.

In an embodiment, when the bad block occurs in a target die among the plurality of dies 110-1 to 110-*n*, the controller 200 may determine the preliminary block for replacing the bad block in a replacement die other than the target die among the plurality of dies 110-1 to 110-*n* based on the remapping information table 221. For example, when the bad block occurs in the target die, the controller 200 may determine the replacement die corresponding to the target die based on the replacement die recommendation information. The controller 200 may replace the bad block with the preliminary block included in the replacement die based on the information on whether the full plane interleaving operation corresponding to the replacement die is possible.

Figure 2:
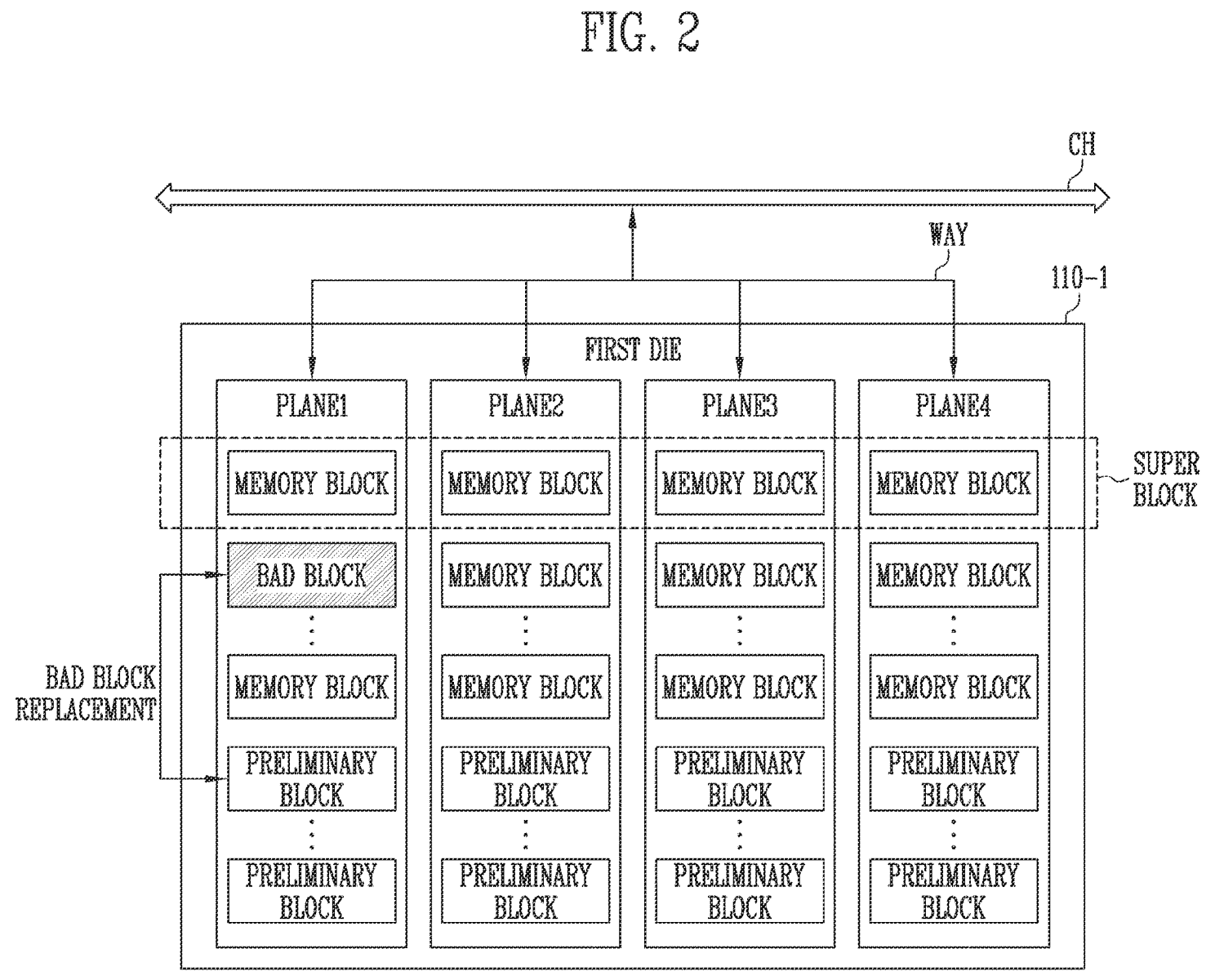

FIG. 2 is a diagram for describing replacing a bad block with a preliminary block included in a target die according to an embodiment of the present disclosure. In FIG. 2, for convenience of description, the description is based on a first die 110-1. However, operations described with reference to FIG. 2 may be equally applied to other dies.

Referring to FIG. 2, the first die 110-1 may include a plurality of planes PLANE1 to PLANE4. However, for convenience of description, in the present specification, it is assumed that one die includes four planes. The plurality of planes PLANE1 to PLANE4 may be commonly connected to a way WAY.

The controller 200 may control the memory block in a super block unit. A super block may be a memory block group configured of a plurality of memory blocks. For example, a plurality of memory blocks included in different planes among the plurality of planes PLANE1 to PLANE4 may configure the super block. One super block may include a stripe or a super page. In storing data or reading stored data, the controller 200 may store data or read data in a stripe unit or a super page unit. The preliminary block may also be controlled in a super block unit similarly to the memory block.

In an embodiment, when the bad block occurs in the first die 110-1, the controller 200 may replace the bad block with a preliminary block included in the first die 110-1. For example, the bad block may occur in a first plane PLANE1. In this case, the controller 200 may control the data storage device 100 to replace the bad block with any one of preliminary blocks included in the plurality of planes PLANE1 to PLANE4.

In an embodiment, the full plane interleaving operation may be a method of controlling all planes PLANE1 to PLANE4 so that operations of all memory blocks included in one super block overlap.

Figure 3:
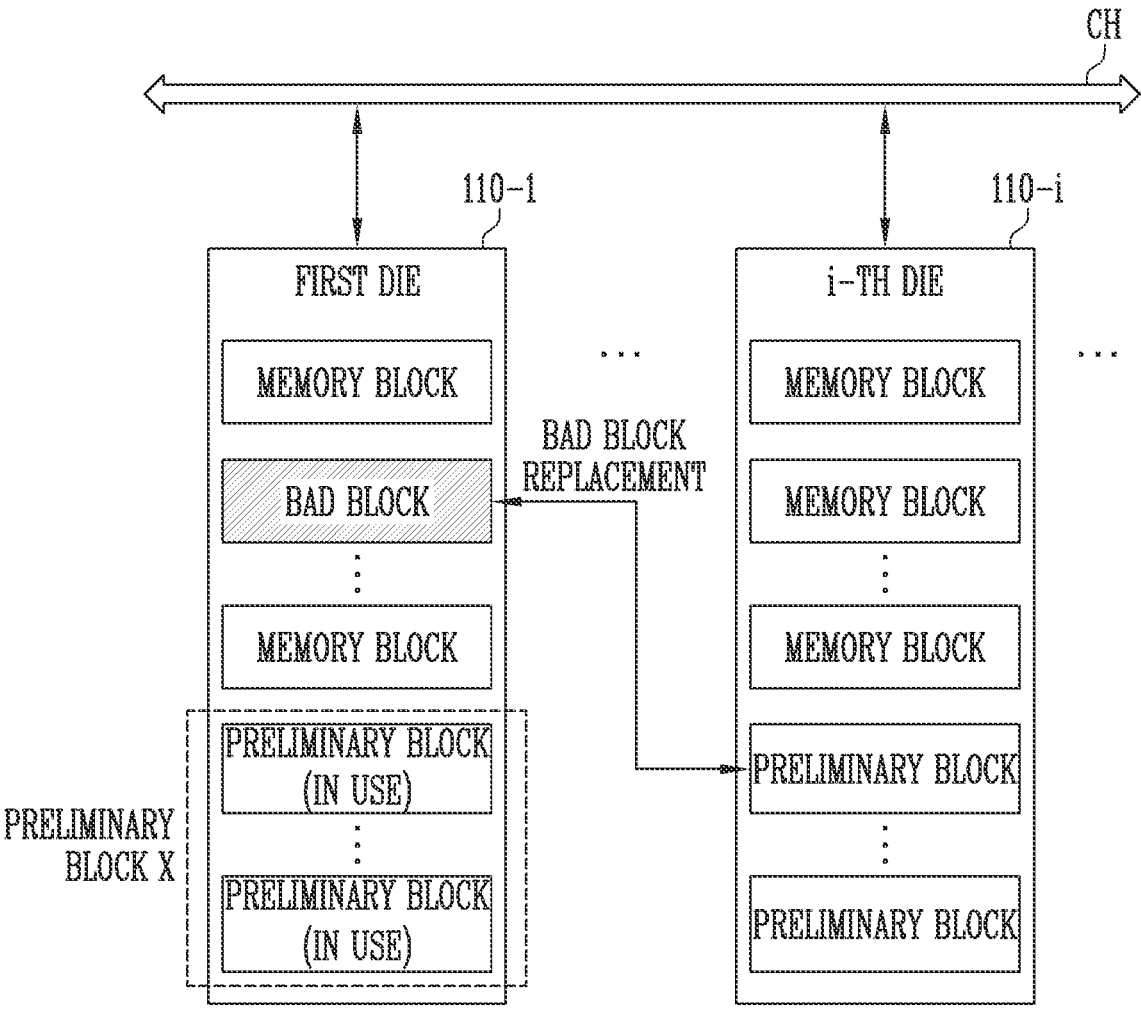
FIG. 3 is a diagram illustrating for describing replacing a bad block with a preliminary block included in a replacement die according to an embodiment of the present disclosure.

FIG. 3 is a diagram for describing replacing a bad block with a preliminary block included in a replacement die according to an embodiment of the present disclosure.

Referring to FIG. 3, when the bad block occurs in the target die, in a case where the preliminary block included in the target die does not exist, the controller 200 may replace the bad block with the preliminary block included in the replacement die.

In an embodiment, when the bad block occurs in the first die 110-1, the controller 200 may determine whether the preliminary block exists in the first die 110-1 based on information on whether a full plane interleaving operation corresponding to the first die 110-1 is possible. At this time, when the preliminary block does not exist, the controller 200 may determine an i-th die. The controller 200 may control the data storage device 100 to replace the bad block of the first die 110-1 with a preliminary block included in the i-th die 110-*i*.

In an embodiment, the controller 200 may determine the i-th die 110-*i*, which is a replacement die corresponding to the first die 110-1, based on the remapping information table, and determine the preliminary block included in the i-th die 110-*i*. The remapping information table 221 is described in detail with reference to FIG. 4, which will be described later.

FIG. 4 shows a remapping information table according to an embodiment of the present disclosure.

Referring to FIG. 4, the remapping information table 221 may include die identification information, replacement die recommendation information, and full plane interleaving information.

In an embodiment, the die identification information may be information for identifying the plurality of dies 110-1 to 110-*n*. In an embodiment, the die identification information may be set based on a sequence in which the plurality of dies 110-1 to 110-*n* operate according to a die interleaving operation.

In an embodiment, the replacement die recommendation information may be information indicating the replacement die for selecting the preliminary block when the bad block occurs in the target die but the preliminary block does not exist in the target die. For example, when the bad block occurs in the first die 110-1, but the preliminary block does not exist in the first die 110-1, the controller 200 may determine the i-th die 110-*i* based on the replacement die recommendation information.

In an embodiment, the replacement die recommendation information may be generated based on a required scheduling time of a program command (i.e., a time required for scheduling a program command) instructing a program operation on a replacement die. For example, the replacement die corresponding to each of the plurality of dies 110-1 to 110-*n* may be set as a die operating in a sequence (i−1) delayed from an operation sequence of each of the plurality of dies 110-1 to 110-*n* according to the required scheduling time.

In an embodiment, the controller 200 may update the replacement die recommendation information according to a preset cycle. For example, the controller 200 may update the replacement die recommendation information each time power is applied to the storage device 50 according to a power cycle. As another example, the controller 200 may update the replacement die recommendation information at regular time intervals.

In an embodiment, the full plane interleaving information may be information on whether the full plane interleaving operation is possible. For example, according to the full plane interleaving information, the i-th die 110-*i* may be able to perform the full plane interleaving operation. In this case, the controller 200 may control a plurality of planes included in the i-th die 110-*i* based on the full plane interleaving operation. As another example, according to the full plane interleaving information, an n-th die 110-*n* may not be able to perform the full plane interleaving operation. In this case, the controller 200 may not control the plurality of planes included in the n-th die 110-*n* according to the full plane interleaving operation.

In an embodiment, the controller 200 may determine the preliminary block in the replacement die based on the information on whether the full plane interleaving operation is possible. For example, the i-th die 110-*i* may be able to perform the full plane interleaving operation. In this case, the controller 200 may replace the bad block of the first die 110-1 using the preliminary block included in the i-th die 110-*i*.

In an embodiment, when the full plane interleaving operation is not possible in the replacement die according to the information on whether the full plane interleaving operation is possible, the controller 200 may determine a preliminary block included in another die other than the replacement die. For example, the n-th die 110-*n* may not be able to perform the full plane interleaving operation. In this case, a target die corresponding to the n-th die 110-*n* may not select the n-th die 110-*n*, and may select another die that is able to perform the full plane interleaving operation. At this time, the selected die may be a die that operates after the n-th die 110-*n*.

In an embodiment, when the full plane interleaving operation is not possible in all dies, the controller 200 may determine a preliminary block included in a die having a next operation sequence of the target die.

Figure 5:
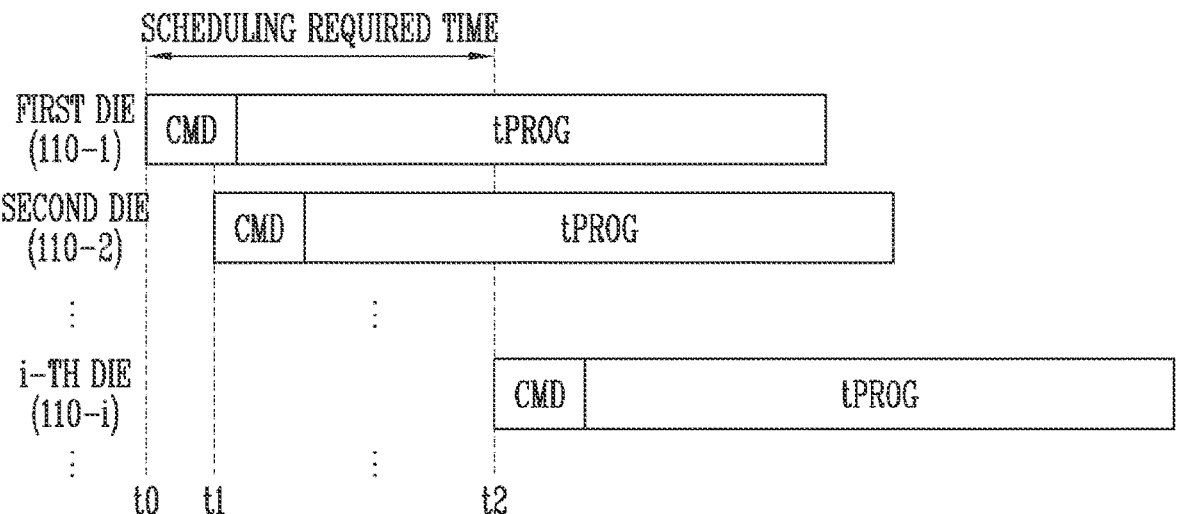
FIG. 5 is a diagram for describing setting a replacement die corresponding to each of a plurality of dies according to an embodiment of the present disclosure.

FIG. 5 is a diagram for describing setting a replacement die corresponding to each of a plurality of dies according to an embodiment of the present disclosure.

Referring to FIG. 5, the controller 200 may generate the replacement die recommendation information based on the required scheduling time of a program command CMD that instructs a program operation on the replacement die.

In an embodiment, the required scheduling time may be a time required to schedule the program command CMD for the plurality of dies 110-1 to 110-*n*.

In an embodiment, the controller 200 may calculate the required scheduling time based on overhead of the controller 200 that occurs when issuing the program command CMD for each of the plurality of dies 110-1 to 110-*n*, a time required for a program operation on each of the plurality of dies 110-1 to 110-*n*, and a time required for an operation of replacing the bad block with the preliminary block.

In an embodiment, the controller 200 may sequentially issue the program command CMD for each of the plurality of dies 110-1 to 110-*n* according to a predetermined issue sequence based on the die interleaving operation. For example, at t0, the program command CMD for the first die 110-1 may be issued. The first die 110-1 may perform the program operation during a program operation required time tPROG. After the program command CMD for the first die 110-1 is issued, at t1, the program command CMD for the second die 110-2 may be issued. The second die 110-2 may perform the program operation during the program operation required time tPROG.

In an embodiment, the controller 200 may generate the replacement die recommendation information to include information setting a die having a sequence in which the program command CMD is to be issued at a time point when the required scheduling time has elapsed from a time point when the program command CMD for each of the plurality of dies 110-1 to 110-*n* is issued as the replacement die corresponding to each of the plurality of dies.

For example, the controller 200 may set the i-th die 110-I having a sequence in which the program command CMD is to be issued at a time point t2 when the required scheduling time has elapsed from the time point to when the program command CMD for the first die 110-1 is issued as the replacement die corresponding to the first die 110-1. The controller 200 may generate the replacement die recommendation information to include information setting the replacement die.

FIG. 6 is a diagram for describing information on whether a full plane interleaving operation is possible according to an embodiment of the present disclosure.

Referring to FIG. 6, information on whether the full plane interleaving operation is possible 600 may further include information indicating whether a plurality of super blocks included in each die are able to perform the full plane interleaving operation.

Meanwhile, in FIG. 6, information on super blocks configured of preliminary blocks is shown for convenience of description. However, this is only an example, and the remapping information table 221 may further include information indicating whether each of super blocks configured of normal memory blocks are able to perform the full plane interleaving operation. In addition, the information on whether the full plane interleaving operation is possible shown in FIG. 6 may indicates information on whether the full plane interleaving operation corresponding to the i-th die 110-*i*, which is the replacement die of the first die 110-1 is possible.

In an embodiment, the controller 200 may generate the information on whether the full plane interleaving operation is possible 600 to include information setting that the full plane interleaving operation is possible for a super block that does not include the bad block, among the plurality of super blocks.

For example, the controller 200 may set information that the full plane interleaving operation is possible for a first super block that does not include the bad block.

In an embodiment, the controller 200 may generate the information on whether the full plane interleaving operation is possible 600 to include information setting that the full plane interleaving operation is not possible for a super block including the bad block, among the plurality of super blocks.

For example, the controller 200 may set information that the full plane interleaving operation is not possible for a second super block and an n-th super block including the bad block.

In an embodiment, the controller 200 may replace the bad block with the preliminary block included in the super block that is able to perform the full plane interleaving operation, among the plurality of preliminary blocks included in the replacement die, based on the information on whether the full plane interleaving operation is possible 600.

For example, the controller 200 may select the first super block that is able to perform the full plane interleaving operation, among the plurality of super blocks included in the i-th die 110-*i*. The controller 200 may determine an unused preliminary block among preliminary blocks included in the first super block as the preliminary block for replacing the bad block of the first die 110-1. The controller 200 may control the data storage device 100 to replace the bad block with the determined preliminary block.

Figure 7:
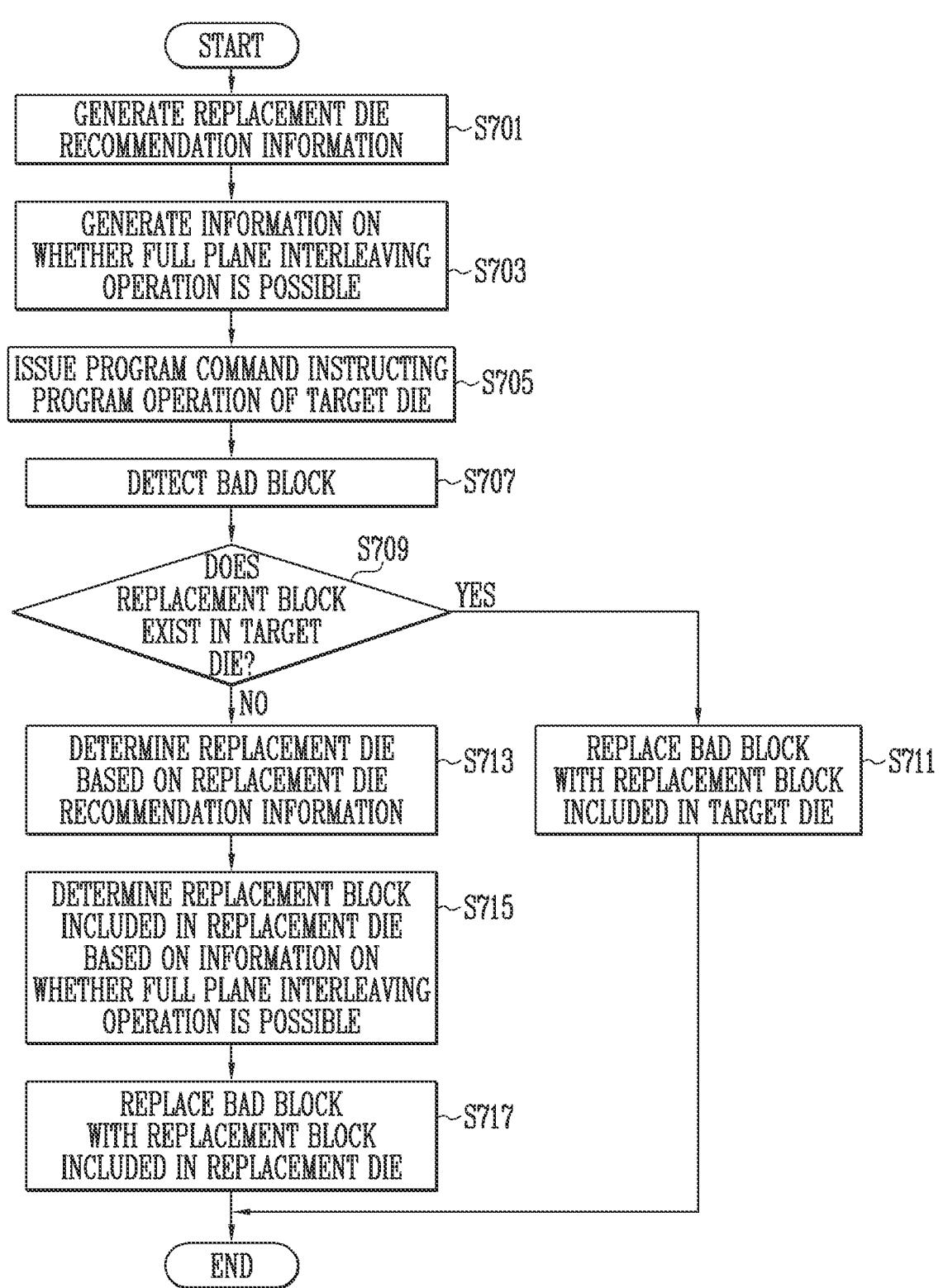
FIG. 7 is a flowchart illustrating a method of operating a storage device according to an embodiment of the present disclosure.

FIG. 7 is a flowchart illustrating a method of operating a storage device according to an embodiment of the present disclosure. The method shown in FIG. 7 may be performed, for example, by the storage device 50 shown in FIG. 1.

Referring to FIG. 7, in operation S701, the storage device 50 may generate the replacement die recommendation information corresponding to each of the plurality of dies. For example, the storage device 50 may set the die having the sequence in which the program command is to be issued at a time point delayed according to the required scheduling time of the program command from a time point when the program command for each of the plurality of dies is issued as the replacement die corresponding to each of the plurality of dies.

In operation S703, the storage device 50 may generate the information on whether the full plane interleaving operation corresponding to each of the plurality of dies is possible. For example, the storage device 50 may generate the information on whether the full plane interleaving operation is possible, based on whether the plurality of memory block groups configured of the plurality of preliminary blocks included in different planes among the plurality of planes included in the plurality of dies include the bad block.

In operation S705, the storage device 50 may issue the program command instructing the program operation of the target die among the plurality of dies.

In operation S707, the storage device 50 may detect the bad block during the program operation of the target die.

In operation S709, the storage device 50 may determine whether the replacement block exists among the plurality of preliminary blocks included in the target die.

When the replacement block included in the target die exists (i.e., YES in operation S709), the storage device 50 may replace the bad block with the replacement block included in the target die in operation S711.

When the replacement block included in the target die does not exist (i.e., NO in operation S709), the storage device 50 may determine the replacement die corresponding to the target die among the plurality of dies based on the replacement die recommendation information in operation S713.

In operation S715, the storage device 50 may determine the replacement block among the plurality of preliminary blocks included in the replacement die based on the information on whether the full plane interleaving operation corresponding to the replacement die is possible. For example, the storage device 50 may select the replacement block included in the memory block group that does not include the bad block among the plurality of memory block groups included in the replacement die.

In operation S717, the storage device 50 may replace the bad block with the replacement block included in the replacement die.

Figure 8:
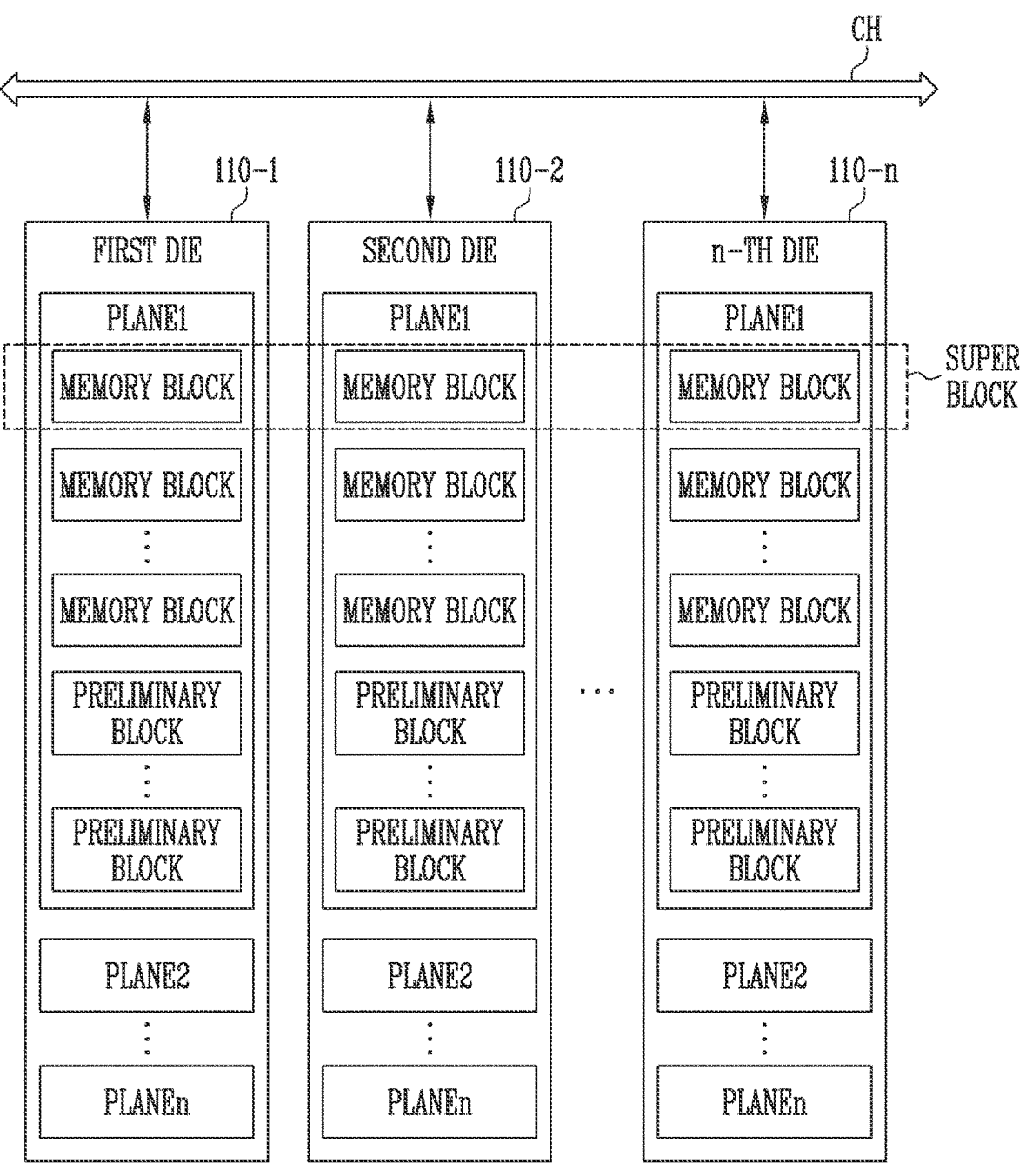
FIG. 8 is a diagram for describing a super block according to an embodiment of the present disclosure.

FIG. 8 is a diagram for describing a super block according to an embodiment of the present disclosure.

Specifically, the super block of FIG. 8 may be configured in a method different from the super block of FIG. 2.

Referring to FIG. 8, the super block may be a memory block group configured of the plurality of memory blocks. For example, each of the plurality of dies 110-1 to 110-n may include a plurality of planes PLANE1 to PLANEn. Each of the plurality of memory blocks included in the super block may be included in different first planes PLANE1. At this time, each of first planes PLANE1 may be included in different dies 110-1 to 110-n.

One super block may include a stripe or a super page. In storing data or reading stored data, the controller 200 may store data or read data in a stripe unit or a super page unit. The preliminary block may also be controlled in the super block unit similarly to the memory block.

In an embodiment, the full plane interleaving operation may be a method of controlling all first planes PLANE1 so that operations of all memory blocks included in one super block overlap.

While the present disclosure has been shown and described with reference to certain embodiments thereof, it will be understood by those skilled in the art that various changes in form and details may be made therein without departing from the scope of the present disclosure and any equivalents. Therefore, the scope of the present disclosure should not be limited to the above-described embodiments but should include the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

The embodiments of the present disclosure have been described in the drawings and specification. Although specific terminologies are used here, those are only to describe the embodiments of the present disclosure. Therefore, the present disclosure is not restricted to the above-described embodiments and many variations are possible within the scope of the present disclosure. It should be apparent to those skilled in the art that various modifications can be made on the basis of the technological scope of the present disclosure in addition to the embodiments disclosed herein. Furthermore, the embodiments may be combined to form additional embodiments.

What is claimed is:

1. A storage device comprising:
a data storage device including a plurality of dies each including a plurality of planes; and
a controller configured to control the data storage device to perform a program operation,
wherein each of the plurality of planes includes a plurality of memory blocks and a plurality of preliminary blocks, and
wherein the controller, when a bad block occurs in a target die among the plurality of dies, is configured to:
determine a replacement die corresponding to the target die among the plurality of dies based on replacement die recommendation information corresponding to each of the plurality of dies,
select a replacement block among the plurality of preliminary blocks included in the replacement die based on information on whether a full plane interleaving operation corresponding to the replacement die is possible, and
control the data storage device to replace the bad block with the replacement block,
wherein the controller is configured to generate the replacement die recommendation information based on a time required for scheduling a program command instructing the program operation on each of the plurality of dies.

2. The storage device of claim 1, wherein the controller, when the replacement block does not exist in the target die, is configured to determine the replacement die based on the information on whether the full plane interleaving operation corresponding to the target die is possible.

3. The storage device of claim 1, wherein the controller is configured to:

generate remapping information which includes the replacement die recommendation information and the information on whether the full plane interleaving operation is possible, and store the remapping information in a remapping information table.

4. The storage device of claim 3, wherein the controller is configured to update the replacement die recommendation information according to a preset cycle.

5. The storage device of claim 4, wherein the controller is configured to calculate the time required for scheduling the program command based on a) overhead of the controller, which occurs when issuing the program command for each of the plurality of dies, b) a time required for the program operation for the replacement die, and c) a time required for an operation of replacing the bad block with the replacement block.

6. The storage device of claim 4, wherein the controller is configured to sequentially issue the program command for each of the plurality of dies according to a predetermined issue sequence based on a die interleaving operation.

7. The storage device of claim 6, wherein the controller is configured to generate the replacement die recommendation information to include information for setting, as the replacement die, a die corresponding to the issue sequence, among the plurality of dies after the time required for scheduling the program command for the target die has elapsed.

8. The storage device of claim 1, wherein the controller is configured to set a plurality of super blocks each including memory blocks or preliminary blocks of different planes, among the plurality of preliminary blocks included in the plurality of planes.

9. The storage device of claim 8, wherein the controller is configured to set the plurality of super blocks based on planes included in different dies, among the plurality of planes included in the plurality of dies.

10. The storage device of claim 8, wherein the controller is configured to generate the information on whether the full plane interleaving operation is possible to include information setting that the full plane interleaving operation is possible for a super block that does not include the bad block, among the plurality of super blocks.

11. The storage device of claim 10, wherein the controller is configured to select the replacement block among preliminary blocks included in a super block that is able to perform the full plane interleaving operation, among the plurality of super blocks included in the replacement die.

12. The storage device of claim 8, wherein the controller is configured to generate the information on whether the full plane interleaving operation is possible to include information setting that the full plane interleaving operation is not possible for a super block including the bad block, among the plurality of super blocks.

13. A method of operating a storage device including a plurality of dies each including a plurality of planes each including a data storage device including a plurality of memory blocks and a plurality of preliminary blocks, and a controller controlling the data storage device, the method comprising:

generating replacement die recommendation information corresponding to each of the plurality of dies;

generating information on whether a full plane interleaving operation corresponding to each of the plurality of dies is possible;

issuing a program command instructing a program operation of a target die among the plurality of dies;

detecting a bad block during the program operation of the target die;

determining whether a replacement block exists among the plurality of preliminary blocks included in the target die;

determining a replacement die corresponding to the target die among the plurality of dies based on the replacement die recommendation information, in response to a determination that the replacement block does not exist in the target die;

determining the replacement block among the plurality of preliminary blocks included in the replacement die based on the information on whether the full plane interleaving operation corresponding to the replacement die is possible; and replacing the bad block with the replacement block included in the replacement die, wherein generating the replacement die recommendation information comprises generating the replacement die recommendation information based on a time required for scheduling the program command instructing the program operation on each of the plurality of dies.

14. The method of claim 13, wherein generating the replacement die recommendation information further comprises setting, as a replacement die corresponding to each of the plurality of dies, a die having a sequence in which the program command is to be issued, among the plurality of dies, after the time required for scheduling the program command for each of the plurality of dies has elapsed.

15. The method of claim 13, wherein generating the information on whether the full plane interleaving operation is possible comprises generating the information on whether the full plane interleaving operation is possible based on whether a plurality of memory block groups configured of preliminary blocks of different planes, among the plurality of preliminary blocks included in the plurality of dies, include the bad block.

16. The method of claim 15, wherein determining the replacement block included in the replacement die comprises selecting the replacement block among the plurality of preliminary blocks included in a memory block group that does not include the bad block, among the plurality of memory block groups included in the replacement die.

17. A controller for controlling a data storage device including a plurality of dies each including a plurality of planes each including a plurality of memory blocks and a plurality of preliminary blocks, the controller comprising:

a memory configured to store a remapping information table including replacement die recommendation information corresponding to each of the plurality of dies and information on whether a full plane interleaving operation is possible; and a processor configured to select, when a bad block occurs in a first die among the plurality of dies, a replacement block for replacing the bad block, among the plurality of preliminary blocks included in a second die other than a first die among the plurality of dies, based on the remapping information table.

18. The controller of claim 17, wherein the processor is configured to generate the replacement die recommendation information to include information that sets a die having a sequence in which a program command instructing a program operation on the first die is to be issued, among the plurality of dies as the second die, after a time required for scheduling the program command has elapsed.

19. The controller of claim 17, wherein the processor is configured to select the replacement block among the plurality of preliminary blocks included a memory block group that is able to perform the full plane interleaving operation, among the plurality of preliminary blocks included in the second die, based on the information on whether the full plane interleaving operation is possible.

* * * * *